United States Patent
Lifka et al.

(10) Patent No.: US 7,265,807 B2
(45) Date of Patent: Sep. 4, 2007

(54) SEALING STRUCTURE FOR DISPLAY DEVICES

(75) Inventors: Herbert Lifka, Eindhoven (NL); Eliav Itzhak Haskal, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 15 days.

(21) Appl. No.: 10/498,138

(22) PCT Filed: Dec. 3, 2002

(86) PCT No.: PCT/IB02/05132

§ 371 (c)(1),
(2), (4) Date: Jun. 8, 2004

(87) PCT Pub. No.: WO03/050894

PCT Pub. Date: Jun. 19, 2003

(65) Prior Publication Data

US 2005/0041193 A1    Feb. 24, 2005

(30) Foreign Application Priority Data

Dec. 13, 2001    (EP)    ................... 01204874

(51) Int. Cl.
    *G02F 1/1333*    (2006.01)
(52) U.S. Cl. ................. 349/158; 349/122; 349/138
(58) Field of Classification Search ............. 349/122, 349/158, 138
    See application file for complete search history.

(56) References Cited

U.S. PATENT DOCUMENTS

| | | | |
|---|---|---|---|
| 6,146,225 A * | 11/2000 | Sheats et al. | 445/24 |
| 6,198,217 B1 | 3/2001 | Suzuki | |
| 6,198,220 B1 | 3/2001 | Jones | |
| 6,249,330 B1 * | 6/2001 | Yamaji et al. | 349/122 |
| 6,597,111 B2 * | 7/2003 | Silvernail et al. | 313/506 |
| 6,630,980 B2 * | 10/2003 | Sobrinho | 349/158 |
| 6,784,957 B2 * | 8/2004 | Kanou et al. | 349/113 |
| 6,788,379 B2 * | 9/2004 | DaSilva Sobrinho | 349/156 |
| 6,847,097 B2 * | 1/2005 | Fukada et al. | 257/633 |
| 2001/0007491 A1 * | 7/2001 | Maeda | 349/143 |
| 2001/0055086 A1 * | 12/2001 | Maeda | 349/139 |
| 2002/0180924 A1 * | 12/2002 | Sobrinho | 349/158 |
| 2002/0196398 A1 * | 12/2002 | Jones et al. | 349/122 |
| 2003/0062830 A1 * | 4/2003 | Guenther et al. | 313/512 |
| 2003/0098647 A1 * | 5/2003 | Silvernail et al. | 313/506 |
| 2003/0197179 A1 * | 10/2003 | Yamazaki et al. | 257/59 |
| 2005/0054129 A1 * | 3/2005 | Chen et al. | 438/30 |

FOREIGN PATENT DOCUMENTS

| | | | | |
|---|---|---|---|---|
| EP | 0 777 280 A2 | 4/1997 | | |
| EP | 0 977 469 A2 | 2/2000 | | |
| JP | 405088160 A * | 4/1993 | | 349/158 |
| WO | WO0008899 | 2/2000 | | |

* cited by examiner

Primary Examiner—James A Dudek
(74) Attorney, Agent, or Firm—Paul Im

(57) ABSTRACT

The invention relates to a sealing structure (6) suitable for a polymer-based electronic device (1), charaterized in that the sealing structure (6) comprises a first layer (7) of a first dielectric material formed on said device (1) and a second layer (8) of a second dielectric material formed on the first layer (7).

12 Claims, 1 Drawing Sheet

SEALING STRUCTURE FOR DISPLAY DEVICES

Figure 1:
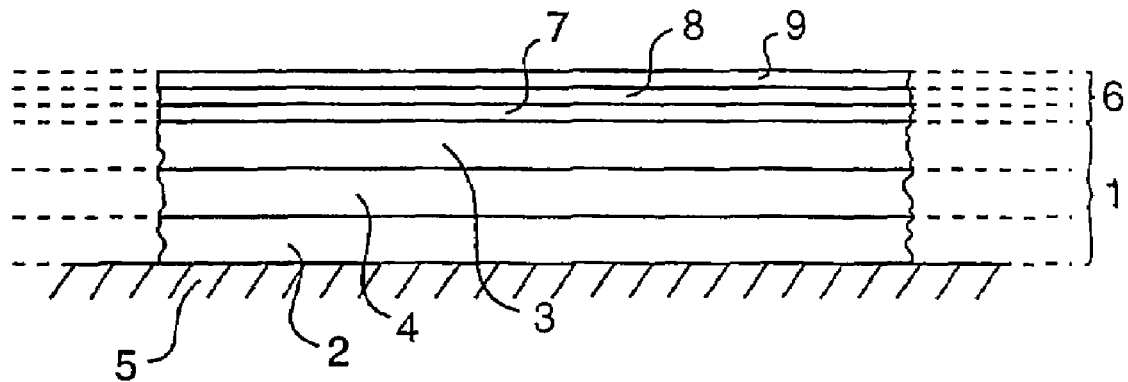

The present invention relates to a sealing structure suitable for display devices, and to a method of sealing the device.

Display devices are well known in graphic display and imaging art. Examples of such devices are organic light emitting devices (OLED) and polymer light emitting devices (PLED), and liquid crystal displays (LCD), which have practical application for TV and graphic displays, as well as in digital printing applications.

Most of these devices are sensitive to oxygen and moisture etc. and, consequently, degrade when exposed to the atmosphere. Exposure to oxygen and/or moisture, particularly in the presence of light, may lead to photo-oxidative degradation of a polymer material used. Furthermore, oxidation at the cathode/polymer interface is one of the first problems arising with oxygen and/or moisture diffusion in devices such as OLEDs or PLEDs. Such reactions will significantly reduce the performance of the light emitting properties of the device. Moreover, other materials used in the display device may also degrade when exposed to the atmosphere; they may be negatively affected by, for example, oxidation.

Therefore, there is a need for an encapsulation of the device. Efforts have been made to evaporate metal films so as to seal display devices. However, these films often contain pinholes, and therefore must be relatively thick, which results in poor light transmission. Many of the known processes for achieving a more or less adequate encapsulation of the devices require temperatures above 300° C. during the encapsulation process. Most polymer-based devices are not compatible with such high temperatures.

WO 00/08899 discloses a light-emitting device with a sealing structure applied by a low-temperature technique encapsulating the device. This sealing structure comprises a non-reactive material, such as aluminium, and a thin film of an inorganic refractory material, as an outermost layer. This structure prevents oxygen and/or moisture from reacting with the materials in the device. However, this sealing structure has problems concerning the non-reactive material, which normally is a metallic film. The metallic film is a conductor, which increases the risk of electronic short-circuits between the electrodes in the device and the metallic film. Moreover, the metallic film in the sealing structure imposes another problem concerning the texture of the electrode material. Sometimes it is necessary to have some kind of texture having negative slopes, which also have to be covered with the sealing structure. However, metals do not normally deposit on such slopes, thus leaving a partly closed surface. In turn, this may allow oxygen and/or moisture to penetrate into the device.

Consequently, the object of the present invention is to provide an encapsulation which overcomes the above problems of the prior art.

These and other objects are achieved by a sealing structure which is characterized in that the sealing structure comprises a first layer of a first dielectric material and a second layer of a second dielectric material. No short-circuits can occur in this structure. Furthermore, making the metal lids superfluous reduces the production costs. Moreover, by using at least two layers of dielectric materials, a pinhole free sealing structure can be obtained and also an even texture having negative slopes for the entire surface of the display device.

Moreover, the sealing structure is suitably transparent and preferably comprises at least one layer of a third dielectric material formed on top of the second layer; the outer layer is then made of a material resistant to the atmosphere.

In accordance with a preferred embodiment of the invention, said first and the third dielectric materials are the same, and are preferably silicon nitride. The second dielectric material is selected from among silicon oxide, silicon oxynitride, silicon oxidefluoride, titanium oxide, tantalum oxide, zirconium oxide, hafnium oxide, aluminium oxide, or any mixture thereof.

The sealing structure of the present invention may also comprise a getter layer which functions as a built-in moisture trap in moisture-sensitive devices.

Moreover, the sealing structure may also comprise a layer of an organic polymer between two layers of dielectric materials, and preferably a getter layer is formed on top of the layer of the organic polymer.

The invention also relates to a method for sealing an polymer-based electronic device, comprising the steps of forming a first layer of a first dielectric material on said electronic device and of forming a second layer of a second dielectric material on top of the first layer. The method also comprising a step of forming at least one layer of a third dielectric material on top of the second layer.

Finally, the present invention relates to a display device, comprising a substrate and at least one sealing structure according to the present invention. The sealing structure may be applied either on the side facing a potential user, or between the substrate and the display device to prevent diffusion of oxygen and/or moisture through the substrate. Moreover, a sealing structure according to the invention may be applied on both sides of the display device.

A preferred embodiment comprises on a flexible substrate an anode and a transparent cathode, in between of which an organic electroluminescent layer is present. The anode preferably comprises a reflective metal, such as Ag, Pt or Au. In this manner, a flexible display is provided wherein the light is not provided through the anode and the substrate, but through the cathode and the transparent and flexible sealing structure of the invention. Preferred materials for the transparent cathode include indium-tin-oxide (ITO) and poly-3,4-ethylenedioxythiophene (PEDOT).

Further preferred embodiments of the invention are described in the remaining dependent claims.

Preferred embodiments of the present invention will be described in detail hereinafter, by way of non-limitative example, with reference to the accompanying drawing.

Figure 2:
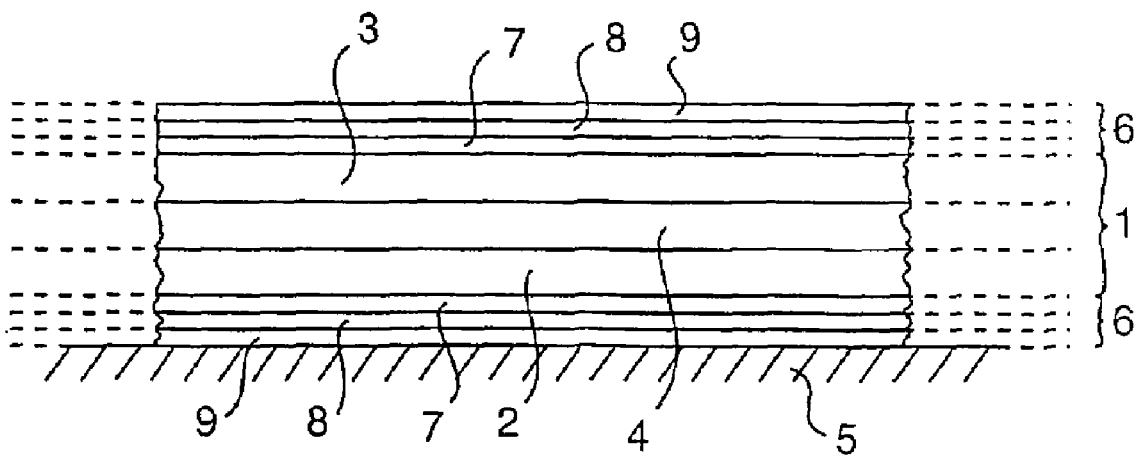

FIG. 1 is a cross-sectional side view of an embodiment of a display device of the present invention, and FIG. 2 is a cross-sectional side elevation another embodiment of the present invention.

The present invention relates to a sealing structure suitable for display devices, such as OLEDs, PLEDs and LCDs.

FIG. 1 shows a PLED display device including a sealing structure according to the present invention. The device 1 is a layered structure of a light-emitting unit, comprising an anode 2, a cathode 3 and a light-emitting layer 4 interposed between the anode 2 and the cathode 3. The light-emitting layer 4 may be selected from among a multitude of luminescent materials, depending on the desired light emitting characteristics, and the layer 4 may consist of a multitude of sub-layers. Suitable materials for the anode 2 are transparent conducting thin films of preferably indium-tin-oxide which enable the light to be emitted by the device at useful levels. The cathode 3 is usually not transparent and comprises, for example, Ba and Al, or LiF and Al. For some applications transparent cathodes are desired, and then, for example, indium-tin-oxide may be used. However, those materials do not limit the present invention in any way and other materials known to those skilled in the art may be used. When a potential difference is applied across the device, light is emitted and the generated color depends on the electronic properties of the luminescent material. Depending on the composition of the material making up the light-emitting layer, many different colors of light may be produced. In the display device 1 it is possible, in conformity with the invention and the properties of anodes and cathodes, to interchange the anode 2 and the cathode 3.

The above embodiment of the display device 1 is arranged on a substrate 5. The substrate 5 is often a soda-lime or boron-silicate glass; however, other, more or less oxygen and/or moisture permeable substrates may be used, for example, plastic and/or flexible substrates. Moreover, the substrate maybe an opaque or a clear substrate. The size, shape and material of the substrate 5 may vary in dependence on the intended use of the device 1. The layered structure of the anode 2, the light emitting layer 4, and the cathode 3 is formed on the substrate 5 using known manufacturing methods, for example, sputtering techniques evaporation techniques and various deposition techniques such as chemical and physical vapor deposition. The appropriate technique to be used depends on the material used for the different layers and will be known to a person skilled in the art.

A sealing structure 6, functioning as a diffusion barrier to oxygen and/or moisture, is formed on the display device, and hence a much longer durability is achieved.

In this embodiment of the present invention the sealing structure 6 consists of three layers 7,8,9 of dielectric materials which are preferably transparent materials. The layer 7 should preferably be of low pinhole density and should cover substantially the entire surface of the cathode 3. The layer 7 of a first dielectric material is formed after the deposition of the cathode 3 without exposing the display device 1 to air, that is, while keeping the device 1 in an inert atmosphere. On top of the layer 7, a layer 8 of a second dielectric material is formed while using preferably the same technique as for the layer 7. Finally, an outer layer 9 of a third dielectric material is formed on top of the layer 8 by essentially the same technique.

The layer 7 preferably comprises silicon nitride which closes most of the area of the device 1 and leaves only a few pinholes open. However, these pinholes would not be closed by making the silicon nitride layer thicker, since the chemical surface of the pinholes prevents sticking of the nitride. By depositing the layer 8, which preferably comprises an oxide, the surface of the layer 7 is modified and the oxide layer 8 will cover the pinholes. However, the oxide layer is generally not a significant diffusion barrier for oxygen and/or moisture as silicon nitride is. Therefore, the layer 9 is deposited on top of the layer 8 and comprises silicon nitride. A N-O-N sealing structure is thus achieved, where N refers to a nitride layer and O to an oxide layer.

A wide range of oxides may be used for the oxide layer 8, and preferably is selected from among silicon oxide, silicon oxynitride, silicon oxidefluoride, titanium oxide, tantalum oxide, zirconium oxide, hafnium oxide, aluminium oxide, or any mixture thereof. Among these materials silicon oxide has shown surprisingly good results and hence is to be preferred.

A low temperature plasma-enhanced CVD (PECVD) method has been used for the formation of the layers 7,8,9. However, other techniques known to those skilled in the art may be used in dependence on the materials used. The sealing structure 6 of the present embodiment comprises about 200 nm of silicon nitride, about 300 nm of silicon oxide and about 200 nm of silicon nitride, deposited at about 80° C. In the case of this sealing structure there is no need for a metallic film between the display device and the dielectric material and, consequently, no short-circuits will occur. Moreover, the production costs are reduced by making the metal lids superfluous.

The N-O-N sealing structure according to the present invention has a water permeation rate of less than $1.10^{-6}$ $g/m^2/day$, which may be improved, without changing the materials, by just adjusting the thickness. Moreover, more than 80% of the visible light spectrum is transmitted. For a N-O-N-O-N sealing structure about 80% of the light of a wavelength of 470 nm and more than 80% for the other part of the visible spectrum is transmitted. Moreover, this sealing structure may also function as an ultraviolet-blocking layer, thereby protecting light-sensitive materials in the device against UV exposure.

The layer thicknesses of the N-O-N and the N-O-N-O-N sealing structures of the invention may vary. Next to a 300-200-300 nm stack good results have been obtained with a stack of 200-100-100-100-100 nm stack, which stack was deposited at 130°. The thickness may be reduced to 50 nm per layer and it is preferred that the first layer has a somewhat larger thickness.

FIG. 2 shows another embodiment of the present invention. In this embodiment, the display device 1 comprises a flexible, plastic substrate 5 and at least one sealing structure 6 of dielectric materials as described above. Since oxygen and/or moisture may penetrate through the flexible substrate 5, a sealing structure 6 according to the present invention is interposed between the substrate 5 and the light-emitting unit 1. The invention is not limited to flexible, plastic substrates, and other substrates may be used. Furthermore, the device may also be encapsulated by applying a sealing structure 6 on the side of the display device facing a potential user. Using this sealing structure 6 on a flexible substrate, it has been demonstrated that more than 80% of the light is transmitted, that is, both visible light and at 470 nm.

Another embodiment of the present invention has a getter layer included in the sealing structure. This getter layer is formed as an additional layer in the sealing structure and may be used irrespective of the number of dielectric layers in the sealing structure. This getter layer functions as a built-in moisture-trap for moisture sensitive devices. In a sealing structure of N-O-N, or in a sealing structure of O-N-O, the getter layer must preferably be formed on top of the oxide layer. This is because an inclusion of oxygen in the CVD process might reduce the efficiency of the getter material. The getter material is preferably chosen so that it does not react with the formulation of the next layer deposited in the sealing structure, and preferably especially so that no reactions take place with nitrogen in the formation of silicon nitride layers. Examples of suitable materials are BaO and CaO. Moreover, metallic calcium reacts only slowly with nitrogen and may also be used.

According to another embodiment of a sealing structure of the present invention, it is possible to form a layer of an organic polymer between two layers of dielectric materials. The dielectric materials used are preferably an oxide or nitride of silicon; however other materials may be used. A getter layer may also be formed, that is, preferably on top of the layer of organic polymer and before the formation of the next layer of dielectric material. However, using a organic polymer in combination with a getter layer, the sealing structure preferably comprises at least one nitride layer, but more preferably more than one nitride layer.

The present invention should not be considered as being limited to the above-described embodiments, but rather includes all possible variations covered by the scope defined by the appended claims. The sealing structure may be used in any situation where an oxygen and/or moisture sealing structure is needed.

Moreover, the present invention is not limited to a sealing structure of N-O-N; other sealing structures of N-O-N-O-N and N-O-N-O-N-O-N etc. may also be used. A sealing structure of O-N-O may also be used. Furthermore, other dielectric materials may also be used. The sealing structure may also comprise a multitude of alternating layers of transparent dielectric materials. The structure is believed to provide unexpectedly good results in that any microcracks or pinholes will be present at a first location in the first layer, and, due to the different constitution of the second layer, at a different location and with different texture in that layer. In any third layer these will be again at another location. In this manner, there is virtually no continuous path through the sealing structure.

The invention claimed is:

1. A sealing structure (6) for a display device (1), characterized in that the sealing structure (6) comprises a first layer (7) of a first dielectric material formed on said device (1), a second layer (8) of a second dielectric material formed on the first layer 97), at least one third layer of a third dielectric material is formed on top of the second layer, and a getter layer, wherein said sealing structure comprise an N-O-N- or O-N-O- structure and the getter layer is formed on top of one of the at least one O layers.

2. A sealing structure according to claim 1, wherein said dielectric materials are transparent.

3. A sealing structure according to claim 1, wherein at least an outer layer (8, 9) facing a potential user comprises a dielectric material resistant to the atmosphere.

4. A sealing structure according to claim 1, wherein the first and the third dielectric materials are essentially the same.

5. A sealing structure according to claim 4, wherein the first and the third dielectric materials are silicon nitride.

6. A scaling structure according to claim 1, wherein the second dielectric material is selected from among silicon oxide, silicon oxynitride, silicon oxidefluoride, titanium oxide, tantalum oxide, zirconium oxide, hafnium oxide, aluminium oxide, or any mixture thereof.

7. A method for sealing a display device (2), comprising the steps of:
    forming a first layer (7) of a first dielectric material on said display device (1),
    forming a second layer (8) of a second dielectric material on top of the first layer (7), and
    forming at least one third layer of a third dielectric material on top of the second layer and a getter layer and wherein said first, second and third layers form an N-O-N- or O-N-O- structure and the getter layer is formed on top of one of the at least one O layers.

8. A method according to claim 7, wherein the first and the third dielectric material are the same.

9. A method according to claim 7, wherein said layers (7, 8, 90) are formed using a low-temperature plasma-enhanced CVD method.

10. A display device (1) comprising a substrate (5) and at least one sealing structure (6) according to claim 1.

11. A display device according to claim 10, wherein the at least one scaling structure is at least formed on the side of the display device (1) facing a potential user.

12. A display device according to claim 10, wherein the at least one sealing structure is interposed between the display device and the substrate (3).

* * * * *